Jan. 26, 1954 L. STASCHOVER 2,667,576

FREQUENCY DISCRIMINATOR CIRCUIT

Filed May 26, 1950

INVENTOR
LEO STASCHOVER
BY Percy P. Lantzy
ATTORNEY

Patented Jan. 26, 1954 2,667,576

UNITED STATES PATENT OFFICE 2,667,576

FREQUENCY DISCRIMINATOR CIRCUIT

Leo Staschover, Jamaica, N. Y., assignor to International Standard Electric Corporation, New York, N. Y., a corporation of Delaware Application May 26, 1950, Serial No. 164,317

3 Claims. (Cl. 250—27)

This invention relates to frequency discriminator circuits for deriving an amplitude modulated signal from a frequency modulated wave.

Certain frequency discriminators which depend for their operation on the phase shift between coupled resonant circuits have heretofore been described as for example in U. S. Patent No. 2,121,103, granted June 21, 1938, to S. W. Selley. The input wave, usually consisting of frequency modulated energy at the intermediate frequency, is applied both to the primary of the transformer and to the mid-point of the secondary. Both the primary and the secondary are tuned to substantially the center frequency of the input wave. The resultant waves in the secondary are phase shifted with respect to each other in accordance with the frequency modulation and are then detected by rectifiers to produce an amplitude modulated wave.

For certain uses the aforedescribed arrangement proves unsatisfactory in practice. For example, it is desirable to tune the primary and secondary individually, since the primary tuning principally determines the shape of the characteristic curve of the discriminator while tuning of the secondary principally determines the center frequency. Permeability of the primary and secondary has been preferred for this purpose. Where wide band operation is desired, for example at frequencies ranging from 10 to 120 megacycles, it becomes necessary to tightly couple the primary and secondary to obtain the wide band characteristic. This however prevents, or at least makes very difficult, the desired individual permeability tuning of the primary and secondary.

Again where the arrangement is to be used for very narrow band operation at low frequencies (for example 100 kilocycles), relatively large high Q primary and secondary inductances are required with a small amount of magnetic coupling between them. At these frequencies, high Q inductances can be obtained either in the form of physically large coils or by the use of small toroidal cores having high permeability dust cores. The disadvantage of toroids is that the magnetic field is almost entirely confined to the core so that negligible coupling exists between cores even in close proximity. On the other hand winding the primary and secondary coils together on the same core cannot be employed since the coupling between them would be close to unity.

An object of the present invention is to provide an improvement over the frequency discriminator circuit hereinabove described.

Another object is to provide a frequency discriminator circuit suitable for wide band applications and in which adjustment of the tuning thereof is facilitated.

A further object is to provide a frequency discriminator circuit which is suitable for very narrow band applications at low frequencies, for example, of the order of 100 kilocycles.

In accordance with a feature of the present invention the magnetically coupled primary and secondary are replaced by an equivalent network, preferably a three terminal network, such as an equivalent of T or $\pi$, in which the elements thereof are substantially free of magnetic coupling and are impedance-coupled. This equivalent network permits adjustment of each element with sufficient freedom from interaction with other elements so as to enable satisfactory and ready adjustment of the discriminator network. It likewise permits ready simulation of the desired amount of intercoupling. Where, however, as is usually the case, the output of the preceeding stage, usually a limiter, is unbalanced with respect to ground, one side of the primary is grounded while both sides of the secondary are floating. A difficulty arises in employing the equivalent three terminal network in such case. According to another feature of this invention the difficulty is overcome by coupling the three terminal network with a transformer which approaches unity coupling such as for example one in which the primary and secondary are interwound on a common form.

In accordance with a main feature of this invention there is provided in a frequency discriminator circuit arrangement of the general type which depends for its operation on the phase shift produced between the voltage across the primary and the secondary of a transformer whose primary and secondary are tuned to the center frequency of the frequency modulated waves, an arrangement comprising an equivalent network, replacing said transformer, whose characteristics are independent of magnetic coupling, and a substantially unity-coupled transformer feeding said network.

The abovementioned and other features and objects of this invention and the manner of obtaining them will become more apparent and the invention itself will be best understood, by reference to the following description of embodiments of the invention taken in conjunction with the accompanying drawings wherein.

Figure 1:
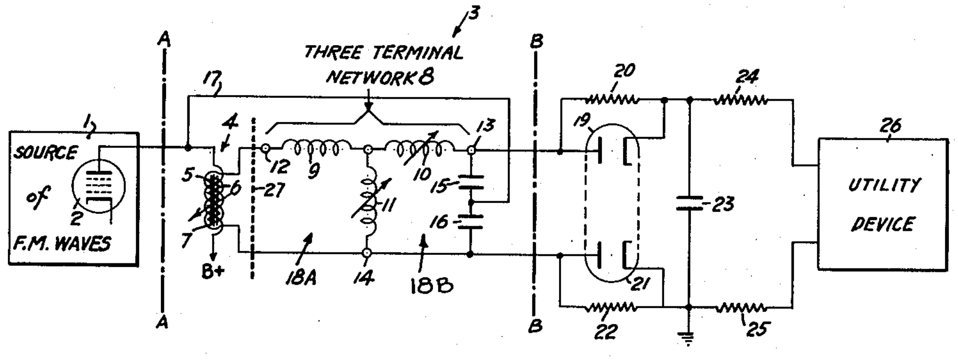
Fig. 1 is a schematic diagram of a frequency discriminator circuit according to the present invention.

Referring to Figure 1, frequency modulated waves are supplied from any suitable source 1 preferably through a limiter 2 to the frequency discriminator network generally indicated by the numeral 3. This frequency discriminator network comprises a closely coupled transformer 4 approaching unity coupling and which may for example have its primary 5 inter-wound with its secondary 6 and be tuned by means of a variable permeability core indicated schematically at 7. The secondary of transformer 4 is fed to a network 8 which is the equivalent of the transformer in the usual type of discriminator circuit generally described hereinabove and whose characteristics are not controlled by magnetic intercoupling between its elements, such as an equivalent three terminal network.

The three terminal network 8 provides two circuits tuned to substantially the center frequency and impedance coupled, deviations of the frequency modulation wave from its center frequency producing a phase shift in the voltages in said circuits in a manner similar to that in a conventional transformer arrangement of the same general type.

The three terminal network is preferably a T equivalent or a π equivalent network, the network illustrated in Fig. 1 being a T. This network consists of series inductances 9 and 10 and a shunt inductance 11, the two series inductances 9 and 10 connecting terminals 12 and 13, with the junction therebetween being connected by inductance 11 to the common terminal 14. Terminals 13 and 14 are connected together by a shunt circuit consisting of two equal value series condensers 15 and 16, with the output of the source 1 of frequency modulated waves being applied to the junction between said condensers and therefore to the midpoint of the electrical shunt circuit by means of line 17. The output of said source is also applied via transformer 4 to the T network, the secondary 6 being connected to terminals 12 and 14.

Two tuned circuits 18A and 18B are provided by the equivalent T network. Tuned circuit 18A consists principally of the inductance of the transformer 4, inductance 9 and inductance 11, and the output capacitance of source 1 and other stray capacitances, while tuned circuit 18B consists principally of inductance 10, condensers 15 and 16 and inductance 11 and miscellaneous stray capacitances. The degree of coupling between circuits 18A and 18B is dependent upon the value of the impedance of the shunt element of the T which is in turn determined by the reactance of inductance 11. The tuning of circuit 18A is controlled by tuning of the transformer 4 through adjustment of its core 7. The tuning of circuit 18B is in turn controlled by tuning the inductance 10. Inductances 10 and 11 are available, as indicated.

As in the conventional transformer type of discriminator the tuning of circuit 18A, which is the equivalent of the primary of conventional discriminator, determines principally the symmetry or linearity of the characteristic curve of the discriminator. The tuning of circuit 18B, which is equivalent to the secondary of the transformer in a conventional discriminator, determines the center frequency of the discriminator. In addition variation of the inductance of the shunt element of the T network controls the effective coupling of the tuned circuits and gives an easy control over the bandwidth of the discriminator.

Terminal 13 is connected to the anode of a diode rectifier 19 shunted by a load resistor 20 while terminal 14 is likewise connected to the anode of a similar diode rectifier 21 likewise shunted by a load resistor 22. The cathode of rectifier 21 is directly connected to ground while the cathode of rectifier 19 is connected via a bypass condenser 23 to ground. The cathodes of diodes 19 and 21 are likewise connected through output resistors 24 and 25 respectively to a utilization device 26 which may be, for example, an audio amplifier or any suitable device.

It should be noted that the inductance 9 of the discriminator network may be replaced by the leakage inductance of transformer 4 and thus inductance 9 may under suitable circumstances be omitted. It should also be noted that inductances 9, 10 and 11 are not magnetically coupled and that their operation is not dependent on any magnetic coupling. Likewise the coils of transformer 4 are not magnetically coupled to the coils of the three terminal network and to indicate this a shield has been schematically shown at 27. Of course it will be understood that a shield is not required except when there is the possibility of such undesired magnetic coupling From the foregoing it will be seen that my discriminator network provides a primary and secondary circuit analogous to the primary and secondary circuits of the conventional transformer with said circuits all being tuned to the center frequency and that the conventional magnetic coupling of the transformer is replaced by impedance coupling. The general theory of operation of the conventional transformer discriminator network of the type likewise applied to the present equivalent network arrangement and will be readily understood without further explanation.

Figure 2:
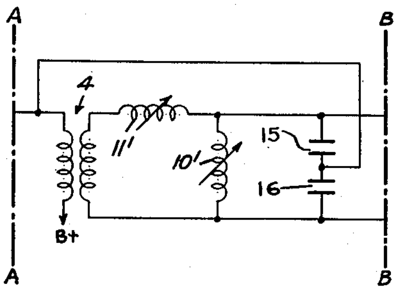
Fig. 2 is a schematic diagram of a modification of the portion of said circuit enclosed between the dotted lines marked AA, BB.

Referring now to Fig. 2 the modification there disclosed provides an equivalent π network in place of the T network of Fig. 1. The transformer 4 provides the input inductance of the π and is equivalent to series inductance 9 of Fig. 1. The output inductance of the π indicated by the numeral 10′ is equivalent to series inductance 10 of Fig. 1. One tuned circuit consists of transformer 4 and the capacitances thereacross which include the output capacitance of the source 1 as well as various stray capacitances. The second tuned circuit consists of the inductance 10′ and the various capacitances thereacross such as those of the shunt circuit including condensers 15 and 16 as well as various stray capacitances. Both tuned circuits, like their equivalents 18A and 18B of Fig. 1, are tuned to the center frequency. The coupling between the tuned circuits is controlled by inductance 11′ at the top of the π network which inductance 11′ has the same general function as inductance 11 of Fig. 1 as an impedance coupling means, but whereas inductance 11 is a shunt inductance, inductance 11′ is in series between the two tuned circuits.

While I have described the equivalent network as being an equivalent three terminal network including either a simple T or simple π equivalent of the conventional transformer it will be readily apparent to those versed in the art that various equivalent lattice networks may be substituted in place thereof without deviating from the teachings of the present invention. It will be apparent that equivalent balanced T and balanced π networks may also be used. In accordance with the teachings of the present invention, however, the elements which control the tuning in each of the two circuits of the network should be free of magnetic coupling with the elements of the other circuit or the characteristics of an adjustable element of each one of said circuits should be independent of the coupling between the elements of the circuits.

While I have described above the principles of my invention in connection with specific apparatus, it is to be clearly understood that this description is made only by way of example and not as a limitation to the scope of my invention.

What I claim is:

1. A frequency discriminator for frequency modulated waves comprising a network having at least a first, second, and third terminal including two circuits each tuned to the center frequency of said waves, the elements of each one of said circuits being independent of magnetic coupling with the elements of the other circuit, and means impedance-coupling said circuits, means for applying a frequency modulated wave across a first and second terminal of said network comprising a closely coupled transformer having substantially unity coupling, means for directly applying said wave to the electrical mid-point between said second and third terminals, and rectifiers coupled to said second and third terminals.

2. A frequency discriminator for frequency modulated waves comprising a network having at least a first, second, and third terminal including two circuits each tuned to the center frequency of said waves, the elements of each one of said circuits being independent of magnetic coupling with the elements of the other circuit, and means impedance-coupling said circuits, means for applying a frequency modulated wave across a first and second terminal of said network, a pair of reactive elements connected in series between said second and third terminals and means for applying said wave to the junction of said reactive elements.

3. A frequency discriminator arrangement according to claim 2, wherein said reactive elements are capacitances of equal value.

LEO STASCHOVER.

References Cited in the file of this patent

UNITED STATES PATENTS

| Number | Name | Date |
|---|---|---|
| 2,231,997 | Guanella | Feb. 18, 1941 |
| 2,410,983 | Koch | Nov. 12, 1946 |
| 2,494,751 | Forster | Jan. 17, 1950 |

FOREIGN PATENTS

| Number | Country | Date |
|---|---|---|
| 860,314 | France | Sept. 24, 1940 |